(12) United States Patent
Mallikararjunaswamy et al.

(10) Patent No.: US 8,120,887 B2
(45) Date of Patent: Feb. 21, 2012

(54) MOS TRANSISTOR TRIGGERED TRANSIENT VOLTAGE SUPPRESSOR TO PROVIDE CIRCUIT PROTECTION AT A LOWER VOLTAGE

(75) Inventors: Shekar Mallikararjunaswamy, San Jose, CA (US); Madhur Bobde, San Jose, CA (US)

(73) Assignee: Alpha & Omega Semiconductor, Ltd. (BM)

( * ) Notice: Subject to any disclaimer, the term of this patent is extended or adjusted under 35 U.S.C. 154(b) by 330 days.

(21) Appl. No.: 11/712,317

(22) Filed: Feb. 28, 2007

(65) Prior Publication Data
US 2008/0218922 A1 Sep. 11, 2008

(51) Int. Cl.
*H02H 3/22* (2006.01)
*H02H 9/00* (2006.01)

(52) U.S. Cl. .......................................... 361/111; 361/56
(58) Field of Classification Search .................. 361/111, 361/56
See application file for complete search history.

(56) References Cited

U.S. PATENT DOCUMENTS

| | | | |
|---|---|---|---|
| 5,243,233 A * | 9/1993 | Cliff ............................. 327/143 |
| 5,452,171 A * | 9/1995 | Metz et al. ...................... 361/56 |
| 5,463,520 A | 10/1995 | Nelson |
| 5,506,742 A | 4/1996 | Marum |
| 5,617,283 A * | 4/1997 | Krakauer et al. ............... 361/56 |
| 5,728,612 A * | 3/1998 | Wei et al. ...................... 438/200 |
| 5,808,506 A * | 9/1998 | Tran .............................. 327/537 |
| 6,175,525 B1* | 1/2001 | Fulkerson et al. ......... 365/189.05 |
| 6,765,771 B2* | 7/2004 | Ker et al. ........................ 361/56 |
| 6,768,616 B2* | 7/2004 | Mergens et al. ................ 361/56 |
| 6,777,721 B1* | 8/2004 | Huang et al. .................. 257/111 |
| 6,823,459 B1* | 11/2004 | Horikoshi et al. .............. 726/17 |
| 6,850,397 B2* | 2/2005 | Russ et al. .................... 361/91.8 |
| 7,064,393 B2* | 6/2006 | Mergens et al. ............. 257/360 |
| 2002/0109950 A1* | 8/2002 | Marr .............................. 361/56 |
| 2004/0043568 A1* | 3/2004 | Ker et al. ...................... 438/279 |
| 2004/0070029 A1 | 4/2004 | Robb et al. |
| 2006/0038550 A1 | 2/2006 | Nazarian |

* cited by examiner

*Primary Examiner* — Jared Fureman
*Assistant Examiner* — Scott Bauer
(74) *Attorney, Agent, or Firm* — Bo-InLin

(57) ABSTRACT

An electronic device formed as an integrated circuit (IC) wherein the electronic device further includes a transient voltage suppressing (TVS) circuit. The TVS circuit includes a triggering MOS transistor connected between an emitter and a collector of a first bipolar-junction transistor (BJT) coupled to a second BJT to form a SCR functioning as a main clamp circuit of the TVS circuit. The TVS circuit further includes a triggering circuit for generating a triggering signal for the triggering MOS transistor wherein the triggering circuit includes multiple stacked MOS transistors for turning into a conductive state by a transient voltage while maintaining a low leakage current.

39 Claims, 9 Drawing Sheets

MOS TRANSISTOR TRIGGERED TRANSIENT VOLTAGE SUPPRESSOR TO PROVIDE CIRCUIT PROTECTION AT A LOWER VOLTAGE

BACKGROUND OF THE INVENTION

1. Field of the Invention

The invention relates generally to a circuit configuration and method of manufacture of a transient voltage suppressor (TVS). More particularly, this invention relates to an improved circuit configuration and method of manufacture of a transient voltage suppressor (TVS) triggered by a MOS thus providing a voltage suppression protection at a significantly reduced voltage, e.g., at 3.3 volts.

2. Description of the Relevant Art

The transient voltage suppressors (TVS) are commonly applied for protecting integrated circuits from damages due to the inadvertent occurrence of an over voltage imposed onto the integrated circuit. An integrated circuit is designed to operate over a normal range of voltages. However, in situations such as electrostatic discharge (ESD), electrical fast transients and lightning, an unexpected and an uncontrollable high voltage may accidentally strike onto the circuit. The TVS devices are required to serve the protection functions to circumvent the damages that are likely to occur to the integrated circuits when such over voltage conditions occur. As increasing number of devices are implemented with the integrated circuits that are vulnerable to over voltage damages, demands for TVS protection are also increased. Exemplary applications of TVS can be found in the USB power and data line protection, Digital video interface, high speed Ethernet, Notebook computers, monitors and flat panel displays.

FIG. 1A-1 shows a typical commercially available two-channel TVS array 10. There are two sets of steering diodes, i.e., diodes 15-H and 15-L and 20-H and 20-L respectively for each of the two input/output (I/Os) terminals I/O-1 and I/O-2. Furthermore, there is a Zener diode, i.e., diode 30, with a larger size to function as an avalanche diode from the high voltage terminal, i.e., terminal Vcc, to the ground voltage terminal, i.e., terminal Gnd. At a time when a positive voltage strikes on one of the I/O pads, the high side diodes 15-H and 20-H provide a forward bias and are clamped by the large Vcc-Gnd diodes, e.g., the Zener diode 30. The steering diodes 15-H and 15-L and 20-H and 20-L are designed with a small size to reduce the I/O capacitance and thereby reducing the insertion loss in high-speed lines such as fast Ethernet applications. FIG. 1A-2 shows the reverse current IR versus reverse blocking voltage characteristics of the two-channel between the Vcc and the ground voltage of the TVS 10 shown in FIG. 1A-1. The reverse current IR as that shown in the diagram of FIG. 1A-2 represents a reverse current conducted through the Zener diode, i.e., between Vcc and GND. Here it is assumed that the reverse BV of each steering diode is higher than the reverse BV of the Zener diode. But note that at high currents when the Vcc to Gnd pad voltage is equal or higher than the summation of the reverse BV of the steering diodes then the current would also flow through all the two series steering diode paths. Since the Zener diode has higher resistance per unit area compared with BJT or SCR and BJT this is actually a disadvantage at higher currents because the steering diodes also have to be rugged in reverse conduction. In the case of the SCR+BJT the Zener clamp voltage is lower at higher currents and hence the steering diodes paths will not conduct. The breakdown voltage of the Vcc-Gnd diode 30 and the steering diodes 15 and 20 should be greater than the operating voltage (Vrwm) so that these diodes only turn-on during the voltage transients. The problem with the Vcc-Gnd clamp diodes is that typically these diodes are very resistive in reverse blocking mode and require large area to reduce resistance. As shown in FIG. 1A-2, the high resistance leads to the increase of BV at high current. This is not desirable as high BV not only causes the break down of steering diodes as described above but also causes damage to the circuit the TVS device intends to protect. The requirement to have large diode size thus limits further miniaturization of a device when such TVS circuit is implemented.

One common method used in the integrated circuits to circumvent this drawback is to use a Zener triggered NPN as the clamp device as that shown in FIG. 1B-1. The TVS circuit 50 shown in FIG. 1B-1 comprises a NPN bipolar transistor 55 connected in parallel to a Zener diode 60 to function as a Zener triggered NPN bipolar TVS device. FIG. 1B-2 shows a current-voltage (IV) diagram for the Zener triggered NPN diode device. FIG. 1B-2 illustrates that when the collector voltage of the NPN 55 reaches the breakdown voltage of the Zener diode 60, the NPN bipolar turns-on and snaps back to a lower voltage called the BVceo or holding voltage where BVceo stands for collector to emitter breakdown voltage with base left open. However, in a device that implements a TVS circuit, the snap-back phenomenon is not desirable. The snap-back creates a sudden drop of the reverse voltage that often causes the circuit oscillations due to negative resistance.

In order to resolve the snap-back difficulties, a patent application Ser. No. 11/444,555 previously submitted on May 31, 2006 by a common inventor of this application. The disclosures made in that Application are hereby incorporated by reference in this Patent Application. The TVS circuits as described in the patent application Ser. No. 11/444,555 are implemented to protect a device operated at a voltage of approximately five volts and are useful for 5V device protection. However, in addition to the technical difficulties related to the sudden large voltage drops as discussed above, there is a need to reduce the transient voltage protection at a further reduced voltage such as 3.3 volts. The TVS circuits disclosed have been effective to protective circuit operated at about five volts, however, would not provide the required protection when the operational voltage is further reduced below five volts as the increasing leakage current of trigger diode would make it practically inoperable.

Therefore, a need still exists in the fields of circuit design and device manufactures for providing a new and improved circuit configuration and manufacturing method to resolve the above-discussed difficulties. Specifically, a need still exists to provide new and improved TVS circuits that can perform good voltage clamping function, occupying smaller areas and eliminating or reducing snapback voltage variations at a further reduced voltage down to a level of approximately between three volts to five volts for protection of device operated at lower voltage level.

SUMMARY OF THE PRESENT INVENTION

It is therefore an aspect of the present invention to provide an improved TVS circuit to have an improved clamping at a further reduced voltage such that TVS protection can be provided for devices operated between a voltage between five to 3.3 volts or lower such that the above discussed limitations and difficulties can be resolved.

Another aspect of this invention is to provide TVS protection circuit with tunable low trigger voltage between 3.3 to 5 volts with low leakage implemented by stacking PMOS diodes.

Another aspect of this invention is to provide TVS protection circuit with a tunable low trigger voltage between 3.3 to 5 volts by implementing the TVS protection circuit as a MOS triggering TVS with tunable low snap-back voltage wherein the a MOS-SCR is operated without a negative resistance while providing good clamping factor.

Another aspect of this invention is to provide TVS protection circuit with a tunable low trigger voltage between 3.3 to 5 volts by implementing the TVS protection circuit with the high side diodes with NBL to suppress the I/O-to-I/O latch-up such that the device performance is further improved.

Briefly in a preferred embodiment this invention discloses a transient voltage suppressing (TVS) circuit for suppressing a transient voltage. The transient voltage suppressing (TVS) circuit includes a triggering MOS transistor connected between an emitter and a collector of a first bipolar-junction transistor (BJT) coupled to a second BJT to form a SCR functioning as a main clamp circuit of the TVS circuit. The TVS circuit further includes a triggering circuit for generating a triggering signal for the triggering MOS transistor wherein the triggering circuit includes multiple stacked MOS transistors for turning into a conductive state by a transient voltage while maintaining a low leakage current. In an exemplary embodiment, the multiple stacked MOS transistors further include multiple stacked PMOS transistors. In an exemplary embodiment, the multiple stacked MOS transistors further includes multiple stacked PMOS transistors each with a body region tied to a source or to Vcc voltage to create a reverse bias. In an exemplary embodiment, the triggering circuit further includes a NMOS transistor and a CMOS transistor for generating the triggering signal for the triggering MOS transistor. In an exemplary embodiment, the multiple stacked MOS transistors further include multiple stacked transistors each with body region tied to source and to Vcc voltage to create a reverse bias for turning into a conductive state by a transient voltage between three to five volts while maintaining a low leakage current. In an exemplary embodiment, the first BJT further includes a NPN bipolar junction transistor (BJT). In an exemplary embodiment, the triggering MOS transistor further includes a NMOS transistor. In an exemplary embodiment, the second BJT coupled to the first BJT forming a silicon controlled rectifier (SCR) wherein the second BJT triggering a SCR current to transmit through the SCR for further limiting an increase of a reverse blocking voltage caused by a transient voltage. In another exemplary embodiment, the triggering MOS transistor triggering the second BJT for transmitting a current through the second BJT in a BJT mode and turning on the SCR at a higher reverse current than an initial current transmitting through the second BJT. In another exemplary embodiment, the TVS circuit further includes at least a steering diode connect in parallel to the triggering circuit for electrically connecting to an I/O terminal for steering a normal current between a high voltage and a low voltage terminal. In another exemplary embodiment, the triggering circuit, the MOS transistor and the first and second BJT are manufactured with a standard CMOS technology and disposed on a semiconductor substrate as an integrated circuit (IC) chip. In another exemplary embodiment, the triggering circuit, the MOS transistor and the first and second BJT are implemented as discrete circuit devices. In another exemplary embodiment, the triggering circuit, the MOS transistor and the first and second BJT are implemented as a mixture of discrete circuit devices and as integrated circuit (IC) chip by applying a standard CMOS technology and with the IC chip disposed on a semiconductor substrate. In another exemplary embodiment, the triggering circuit, the MOS transistor and the first and second BJT are manufactured with a standard Bi-CMOS technology and disposed on a semiconductor substrate as an integrated circuit (IC) chip.

The present invention further discloses a method for manufacturing an electronic device with an integrated transient voltage suppressing (TVS) circuit. The method includes a step of connecting a triggering MOS transistor between an emitter and a collector of a first bipolar-junction transistor (BJT) and coupling a second BJT to form a SCR functioning as a main clamp circuit of the TVS circuit. In an exemplary embodiment, the method further includes a step of generating a triggering signal from a triggering circuit for the triggering MOS transistor by stacking multiple MOS transistors for turning into a conductive state by a transient voltage while maintaining a low leakage current. In an exemplary embodiment, the step of stacking the multiple MOS transistors includes stacking multiple PMOS transistors. In another exemplary embodiment, the step of stacking the multiple MOS transistors includes stacking multiple PMOS transistors each with body region tied to source or to Vcc voltage to create a reverse bias. In another exemplary embodiment, the step of generating the triggering signal from the triggering circuit further includes a step of connecting the multiple stacked MOS transistors to NMOS transistor and CMOS transistor for generating the triggering signal for the triggering MOS transistor. In another exemplary embodiment, the step of stacking the multiple MOS transistors further includes stacking multiple PMOS transistors each with body region tied to source or to Vcc voltage to create a reverse bias for turning into a conductive state by a transient voltage between three to five volts while maintaining a low leakage current.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIG. 1B-1 is a circuit diagram for showing another conventional TVS device and FIG. 1B-2 is an I-V diagram for illustrating the reverse characteristics of the TVS device with the voltage presents a sudden snap-back voltage drop at the time when a current conduction over the NPN bipolar transistor is triggered.

DETAILED DESCRIPTION OF THE METHOD

Figure 2A:
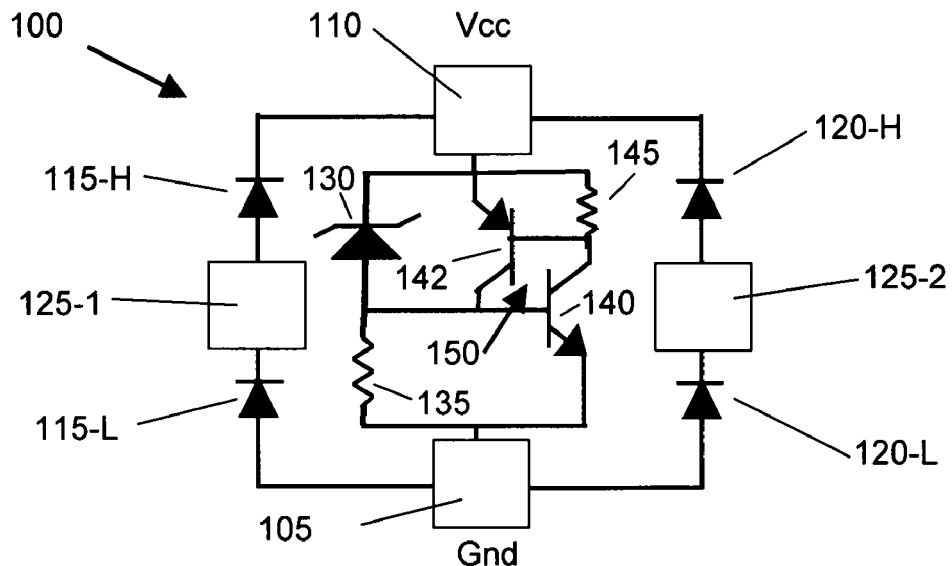
FIG. 2A is a circuit diagram for showing a TVS circuit of this invention and FIG. 2B is an I-V diagram for illustrating the reverse characteristics of the TVS device with significantly reduced snap back voltage drops.
Figure 2B:
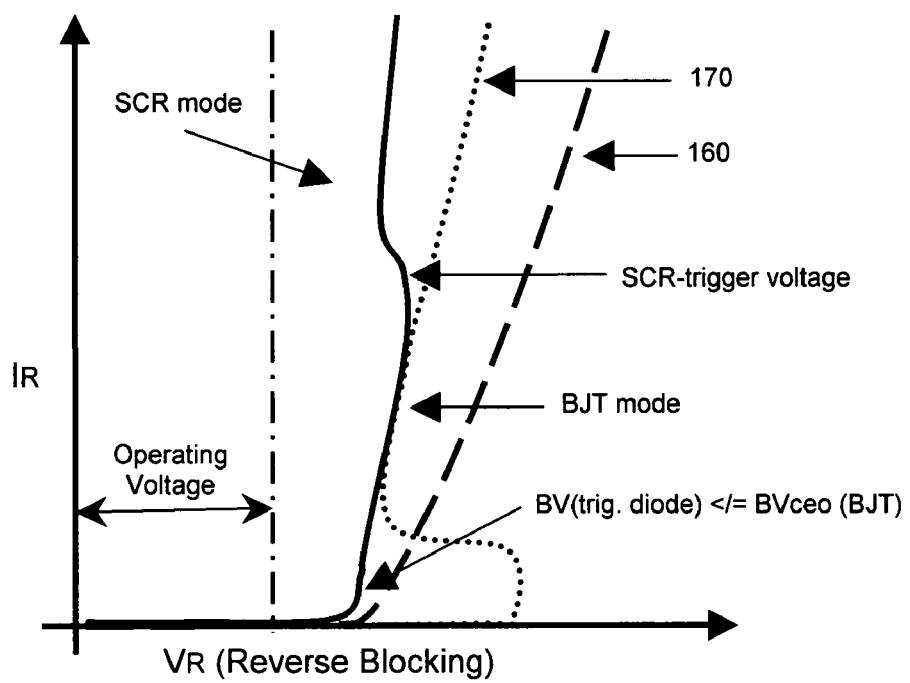

For better understanding of this invention, the descriptions of the FIGS. 2A and 2B below are provided as background reference information of the TVS disclosed previously by a common invention of this application. FIGS. 2A and 2B are respectively a circuit diagram and an I-V diagram, i.e., a current versus voltage diagram, of a TVS circuit 100 disclosed in application Ser. No. 11/444,555. The TVS circuit 100 is installed between a ground voltage terminal (Gnd) 105 and a Vcc voltage terminal 110 to function as a Vcc-Gnd clamp circuit. The TVS circuit 100 includes two sets of steering diodes, i.e., diodes 115-H and 115-L and 120-H and 120-L respectively for each of the two input/output (I/Os) terminals 125-1 and 125-2. Furthermore, there is a Zener diode, i.e., diode 130, with a larger size to function as an avalanche diode from the high voltage terminal, i.e., terminal Vcc, to the ground voltage terminal, i.e., terminal Gnd. The Zener diode 130 is connected in series with a resistor 135 and in parallel to a NPN bipolar transistor 140. A PNP bipolar transistor 142 in configured with NPN bipolar transistor 140 forms a PNPN silicon-controlled rectifier (SCR) structure 150 with high holding current and voltage. The breakdown voltage, i.e., BV, of the triggering diode 130 is less than or equal to the BVceo of the NPN bipolar transistor 140 where BVceo stands for collector to emitter breakdown voltage with the base left open.

$$BV(\text{Trigger Diode}) \leq BVceo$$

Figures 1, 1A:
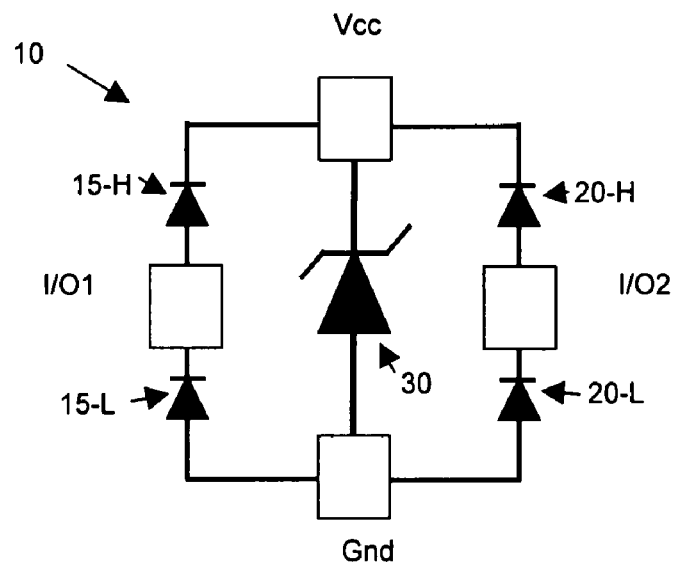
FIG. 1A-1 is a circuit diagram for showing a conventional TVS device and FIG. 1A-2 is an I-V diagram, i.e., a current versus voltage diagram, for illustrating the reverse characteristics of the TVS device.
Figures 1, 1A, 2:
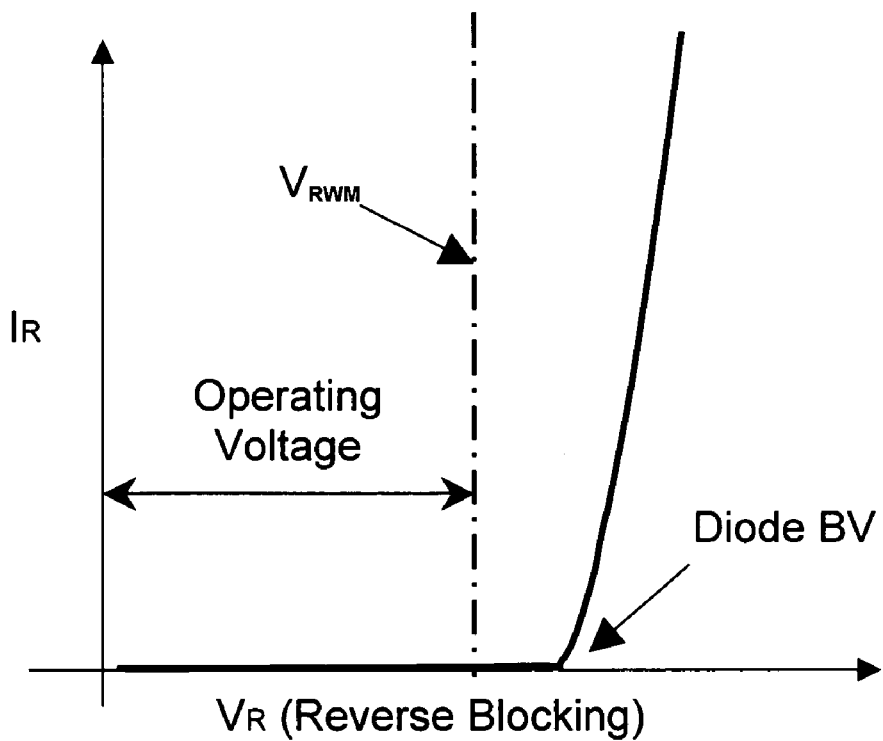
Figures 1, 1B:
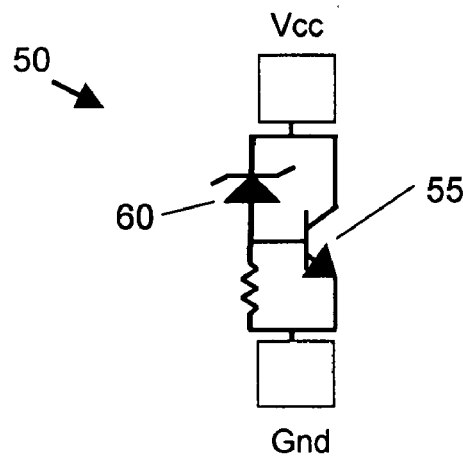
Figures 1, 1B, 2:
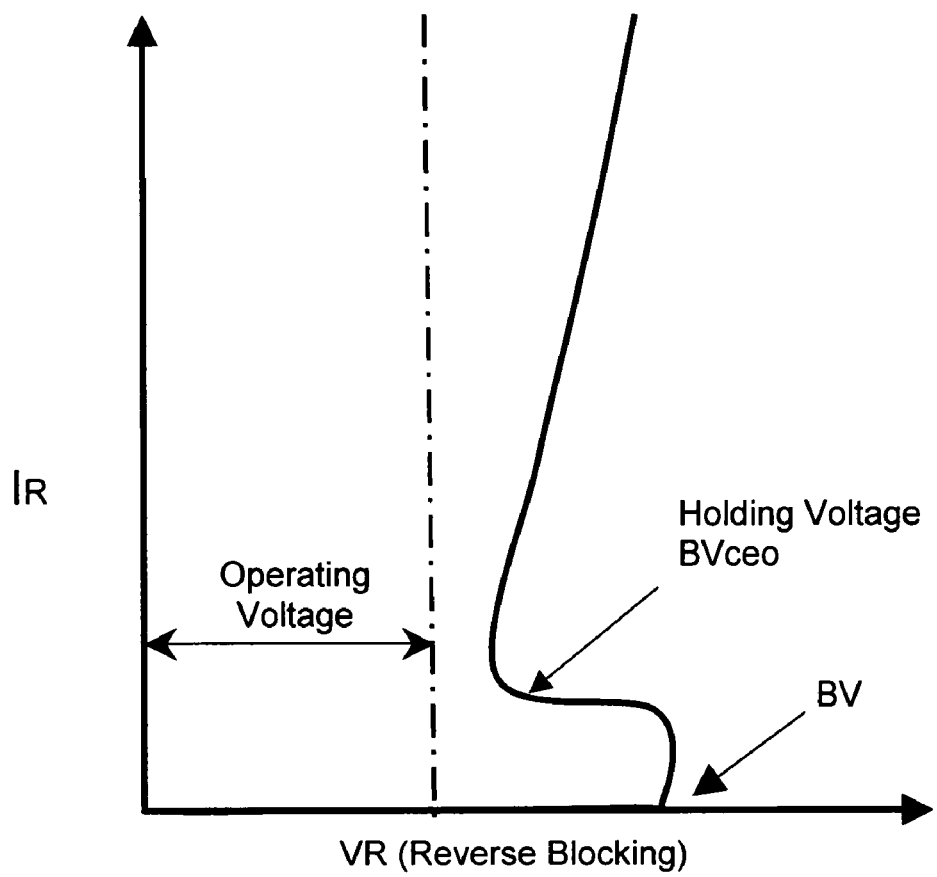

FIG. 2B is a current versus voltage diagram for comparing the operational characteristics of the TVS according to FIG. 2A and the conventional TVS. As a transient voltage higher than a normal operating voltage is applied to the TVS circuit, a reverse current is triggered to pass through the Zener diode 130 because the breakdown voltage BV of the trigger diode 130 is adjust to less than the BVceo. As the voltage increases, the device migrates into BJT mode where the NPN 140 conducts. When the voltage increases further the SCR 150 is activated and begins to conduct current. The turning on of the SCR causes a slight drop of the reverse blocking voltage VR. FIG. 2B also shows the I-V diagrams, i.e., curve 160 for diode TVS of FIG. 1A-1, and curve 170 for BJT TVS of FIG. 1B-1. In contrast to curves 160 and 170, by adjusting BV of trigger diode less than the emitter breakdown voltage with the base left open, i.e., BVceo, the voltage snap back problems are resolved. The sequence of operation mode provides the benefit of fast response as the NPN transistor turns on fast. Furthermore, by turning on the SCR 150 at a SCR trigger voltage to protect the NPN bipolar transistor 140, the increase of BV at high current is minimized as the SCR action incurs the least resistance. This resolves the difficulties of high BV at high current that not only causes the break down of steering diodes but also cause damage to the circuit the TVS device intends to protect.

The detail operation of the TVS system can be further understood from the following descriptions. Typically the TVS is biased in a system with the high voltage terminal Vcc and the ground voltage Gnd connected to the system which needs protection. There are also applications where the Vcc is left floating for specific applications. Then a +Ve or −Ve zap is applied to the I/O terminals with respect to Gnd. When a +Ve zap is applied on I/O the upper diodes are forward biased and when the voltage reaches the trigger diode BV then current flows through the resistor 135 in series with the trigger diode 130. When the drop in the resistor 135 reaches a voltage of 0.6V then the base-emitter junction of the NPN transistor 140 is forward biased and the NPN transistor 140 turns-on. Now the collector current of the NPN transistor flows through the resistor connected between the emitter and base of the PNP transistor 142. When the potential drop in this resistor 145 reaches a voltage of 0.6V then the emitter of the PNP transistor 142 begins to conduct and the SCR action is initiated. So now the current flows from the anode on the PNP 142 transistor, i.e., the emitter of PNP, to the cathode of the NPN transistor 140, i.e., the emitter of the NPN. On the negative zap the bottom diode turns-on in forward conduction between I/O pad and Gnd and ESD current flows only in this diode path. There is also a condition when a voltage zap is applied to the Vcc at a voltage of +Ve with respect to Gnd. Under this zap condition the current flows through the Vcc-Gnd path, i.e., there is no current conducted in the steering diodes, since the trigger diode breaks down and initiates the SCR as described above.

The TVS circuit as described in FIGS. 2A and 2B are implemented to protect a device operated at a voltage of approximately five volts and are useful for 5V device protection. However, in addition to the technical difficulties related to the sudden large voltage drops as encountered in a conventional TVS discussed above, there is a need to reduce the transient voltage protection at a further reduced voltage such as 3.3 volts. Further inventions are disclosed below in this application to provide effective protection for devices operated at reduced voltages between approximately three to five volts.

Figure 3A:
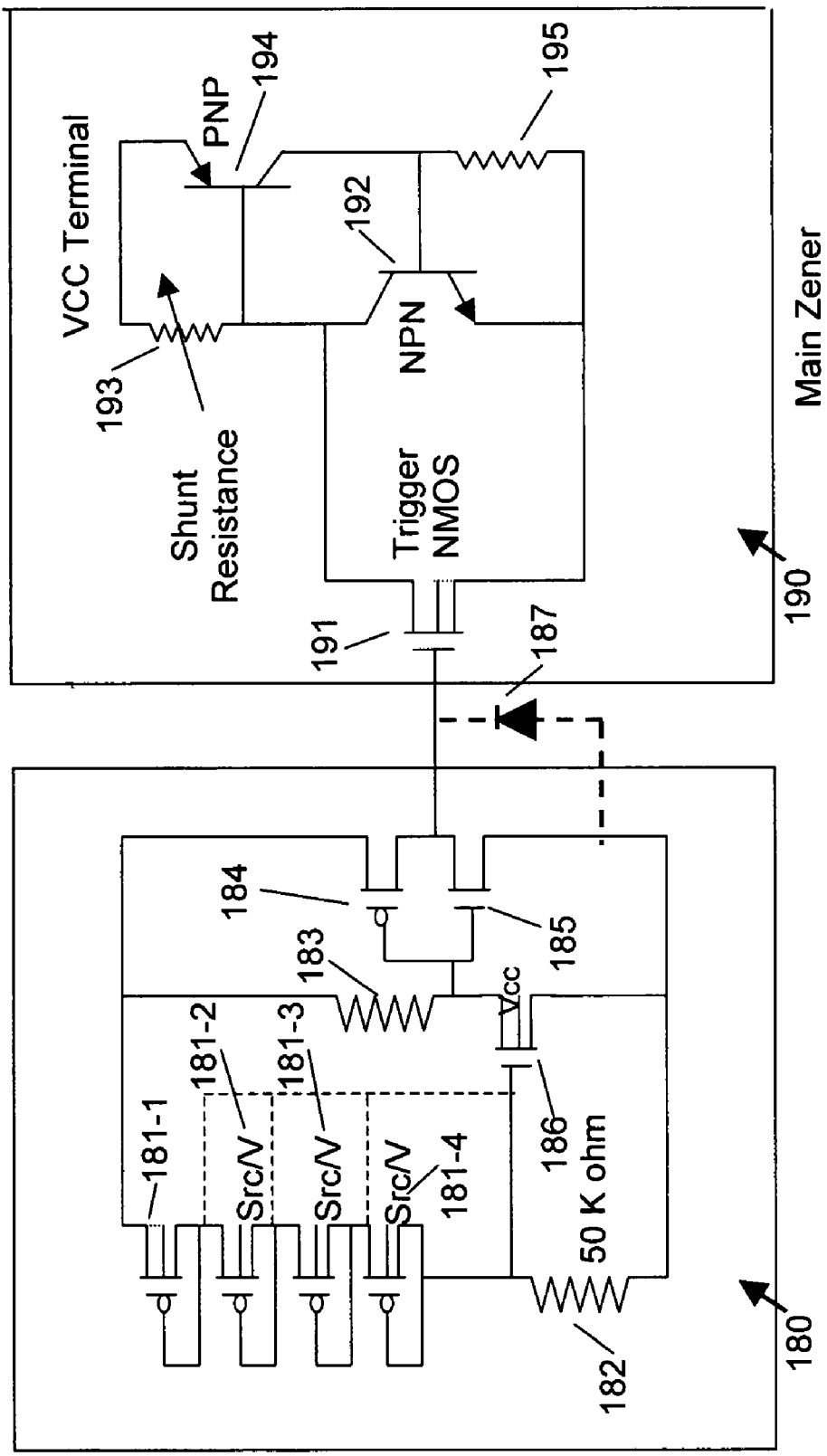
FIG. 3A is a circuit diagram for depicting a MOS triggered TVS of this invention for triggering and protecting a device operated at a voltage between about 3 volts to five volts.

FIG. 3A is a circuit diagram for showing a TVS as an exemplary embodiment of this invention that implements a trigger circuit 180 for providing signal for triggering a main clamp circuit 190. The trigger circuit 180 includes four stacked PMOS transistors 181-1 to 181-4 with body effect wherein each PMOS transistor provide the option to have its body region tied to its source or to Vcc to create a reverse bias between its source and body that would increase the gate threshold voltage. By adjusting the number of PMOS transistor and the options of connecting the body of the PMOS transistors to its source or Vcc, the trigger voltage can be adjusted. In normal operation voltage, the stacking PMOS 181-1 to 181-4 are off because Vcc is not high enough to turn on the stacking PMOS transistors and therefore there is no current passing through resistor 182. The gate voltage of the NMOS 186 is low and below its threshold voltage and the NMOS 186 is turned off because the there is no current passing through the resistor 182 that is connected across the gate and the source of the NMOS transistor 186. The CMOS transistors, e.g., the PMOS 184 and the NMOS 185, has a low output voltage since the Vcc on the CMOS gate turns on the NMOS 185 but turns off the PMOS 184 and the output of the CMOS is connected to the ground through NMOS 185. The low voltage output turns off the trigger NMOS transistor 191 thus turns off the main clamp circuit.

Figure 3B:
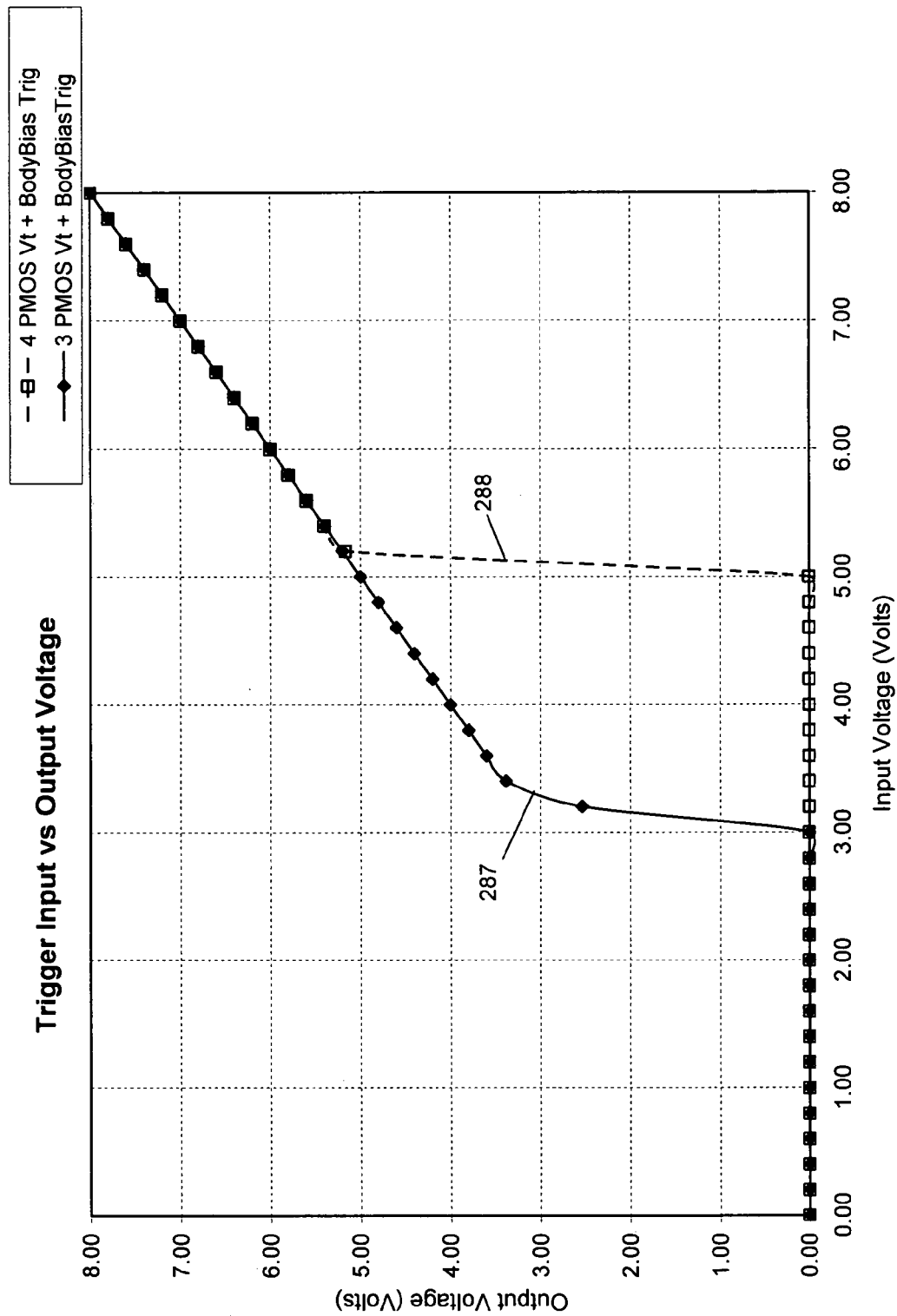
FIG. 3B is a diagram for showing the variation of the input voltage versus output voltage of the trigger circuit with three and four stacked PMOS transistors.
Figure 3C:
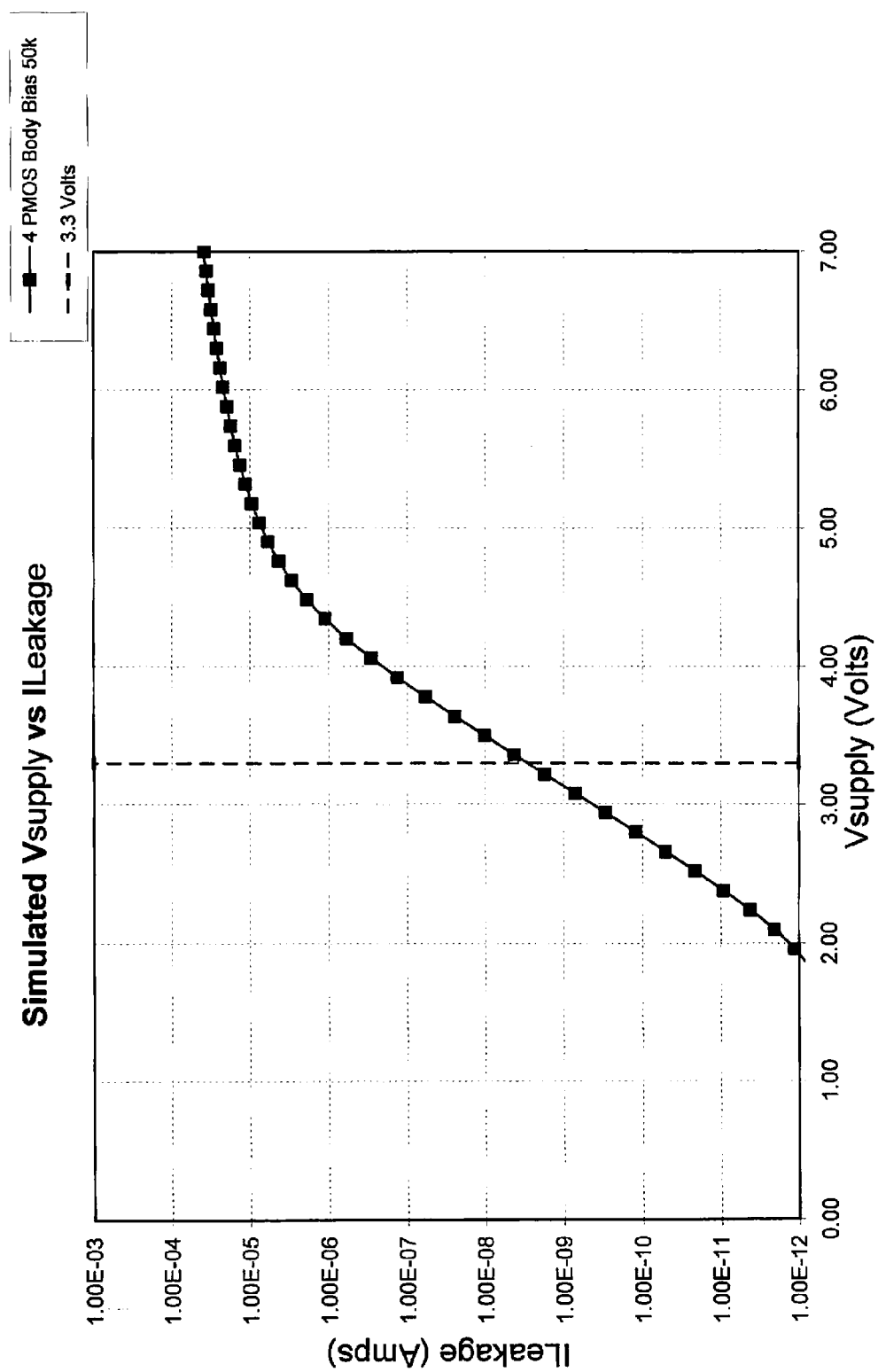
FIG. 3C is a diagram for illustrating the leakage current of trigger circuit as a function of the supply voltage Vcc.

Once a voltage transient event takes place, the voltage imposed onto the stacked PMOS 181-1 to 184-4 exceeds the sum of gate threshold voltages that turns on all of the stacked PMOS transistors causing a current to pass through the resistor 182. When this transient voltage is high enough and exceeds the trigger voltage which is equivalent to the sum of all the stacked PMOS threshold plus the threshold of NMOS 186, the current passing through the stacked PMOS and resistor 182 will increase until the voltage across the gate of the transistor 186 reach its threshold which consequently turns on the transistor 186. Once the transistor 186 conducts then the current passes through the resistor 183 and NMOS 186 to the ground. The ground voltage thus applied to CMOS gate turns off the NMOS 185 and turns on the PMOS 184 and the output voltage of CMOS is pulled up to Vcc thus triggers the main clamp circuit 190. Referring to FIG. 3B that shows the output voltage of the trigger circuit 180 verses the input voltage Vcc. In FIG. 3B, the curve 287 corresponds to the trigger circuit output with three PMOS with body effect and line 288 corresponds to the trigger circuit output with four PMOS with body effect. The trigger voltage changes from about 3 Volts to 5 Volts as the number of stacked PMOS transistor increases from three to four. Below the trigger voltage, the output of trigger circuit 180 is zero volt while it increases linearly as the input voltage Vcc exceeds the designated trigger voltage. In normal working voltage range, the leakage current of trigger circuit 180 is also reduced. FIG. 3C shows the leakage current of trigger circuit 180 verses input voltage Vcc. At normal working voltage of 3.3 Volts, the leakage current is only tens of nano Amps, compare to a Zener diode triggered at similar voltage which has a leakage of micro Amps, one to two order of magnitude improvement is achieved.

With the trigger NMOS 191 turned on, the current passes through the resistor 193 and NMOS 191 and as the current increases so is the voltage drop across the emitter base junction of the PNP junction bipolar transistor (JBT). When the drop in the resistor 193 reaches a voltage of 0.6V then the base-emitter junction of the PNP transistor 194 is forward biased and the PNP transistor 194 turns on. Now the collector current of the PNP transistor flows through the resistor 195 connected between the emitter and base of the NPN transistor 192. When the potential drop in this resistor 195 reaches a voltage of 0.6V then the emitter of the NPN transistor 192 begins to conduct and a SCR mode operation is initiated. A protection diode 187 connecting between the CMOS output and ground is optional in case a high voltage surge is coupled into the CMOS output through a gate drain capacitor of trigger NMOS 191.

Therefore, the main clamp circuit 190 is a MOS trigger SCR that comprises a trigger NMOS 191 connected in series with a resistor 193 in parallel to a PNP bipolar transistor 194. The threshold voltage, of the triggering NMOS 191 is less than or equal to the BVceo of the PNP bipolar transistor 194 where BVceo stands for collector to emitter breakdown voltage with the base left open. Compared to a Zener diode trigger SCR as that shown in FIG. 2A, the leakage current the leakage current of the MOS-SCR is lower than the Zener-trig SCR because if the Zener trigger is adjusted to trig at the same voltage as MOS trigger then the degenerate junction diode of Zener trigger will have higher leakage current.

The variations of current versus the reverse voltage is similar to that shown in FIG. 2B. The snap back is significant reduced with the SCR operation and adjustment of threshold voltage. Furthermore, a lower triggering voltage with low leakage current is now achieved by implementing the triggering NMOS 191 in combination with the trigger circuit 180 implemented with stacking PMOS diodes 181-1 to 181-4 and the MOS transistors 184, 185 and 186.

Figure 4A:
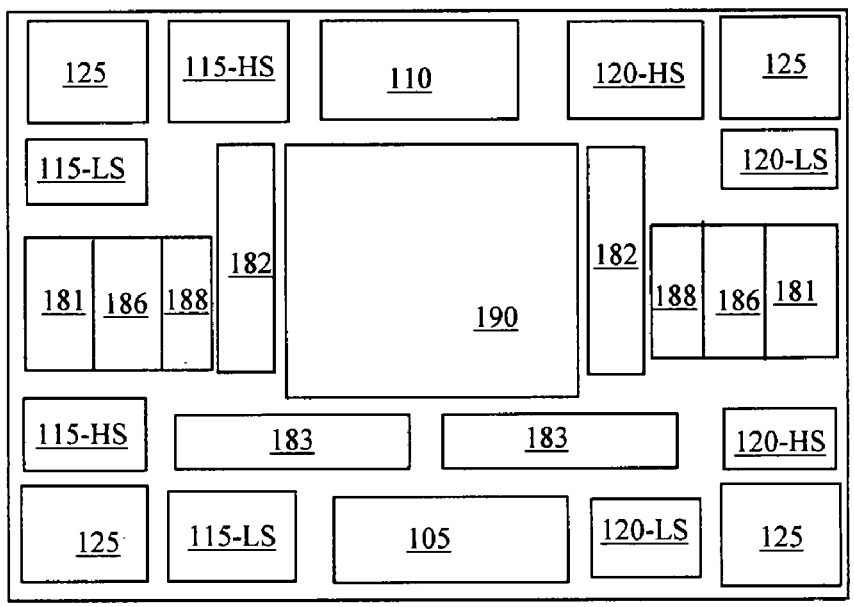
FIGS. 4A and 4B are top views to show the layout of the MOS triggered TVS of this invention.

The circuit as shown in FIG. 3A can be implemented with discrete component or as integrated circuit. FIG. 4A is a layout of an IC implementation. In addition to main clamp circuit area 190 and trigger circuit 180 which comprising stacked PMOS 181, NMOS 186, CMOS 188, resistors 182 and 183, the IC chip further includes a I/O pads 125 and steering diodes 115 and 120 connected as FIGS. 2A and 3A. The device can be manufactured according to standard CMOS process.

Figure 4B:
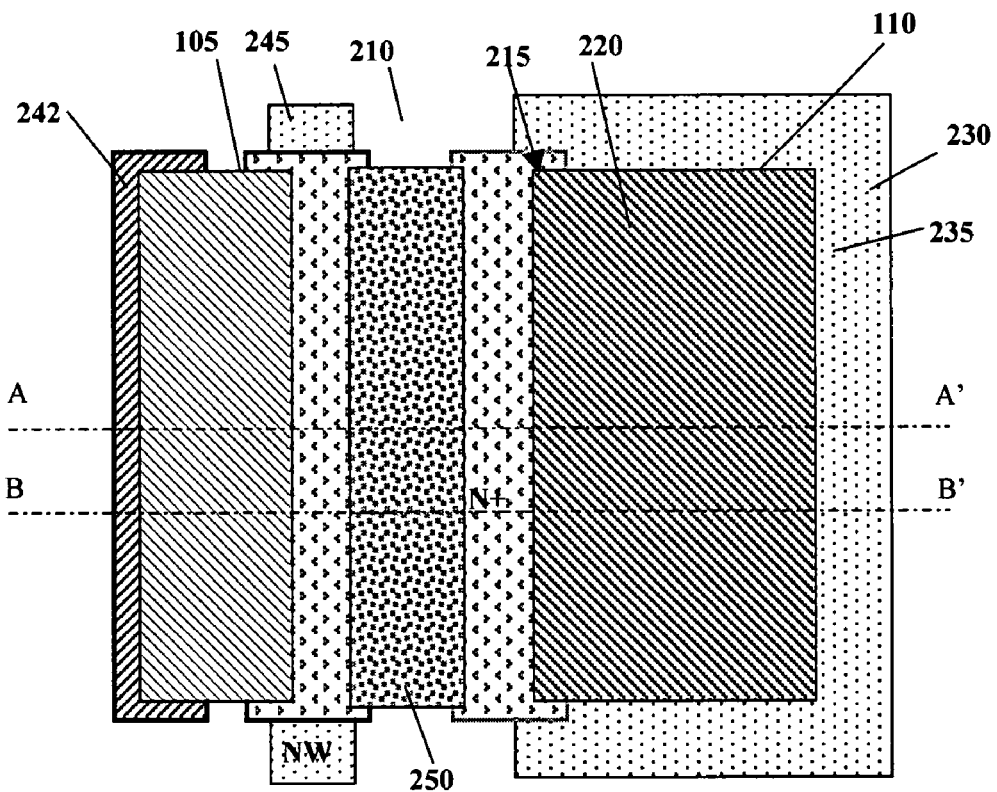
Figure 4C:
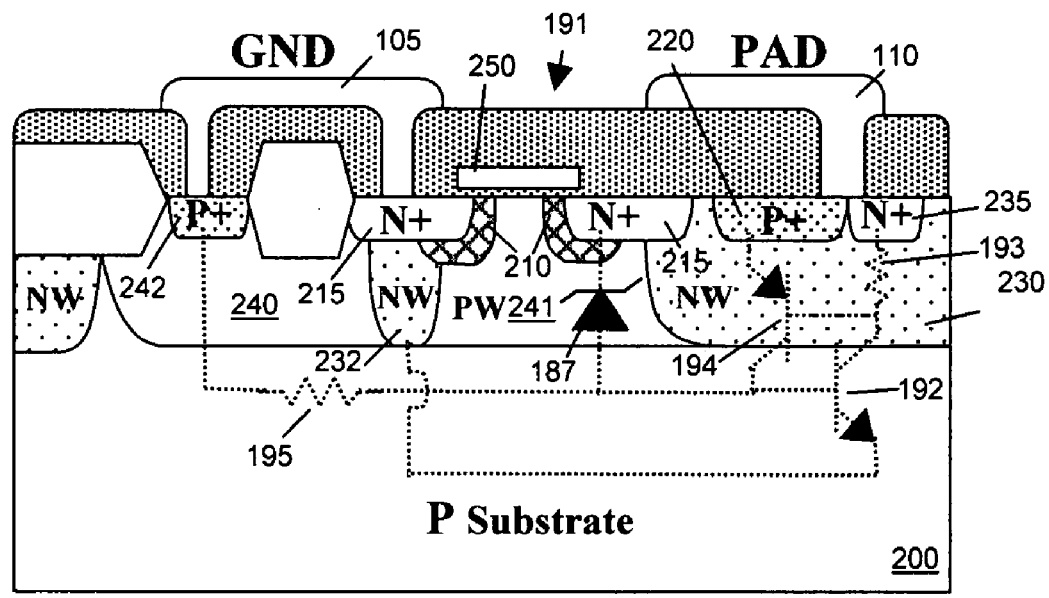
FIGS. 4C to 4D are side cross sectional views along lines A-A' and B-B' of FIG. 4B for showing the circuit components of the TVS device of FIG. 3 with IC implementation supported on a semiconductor substrate.
Figure 4D:
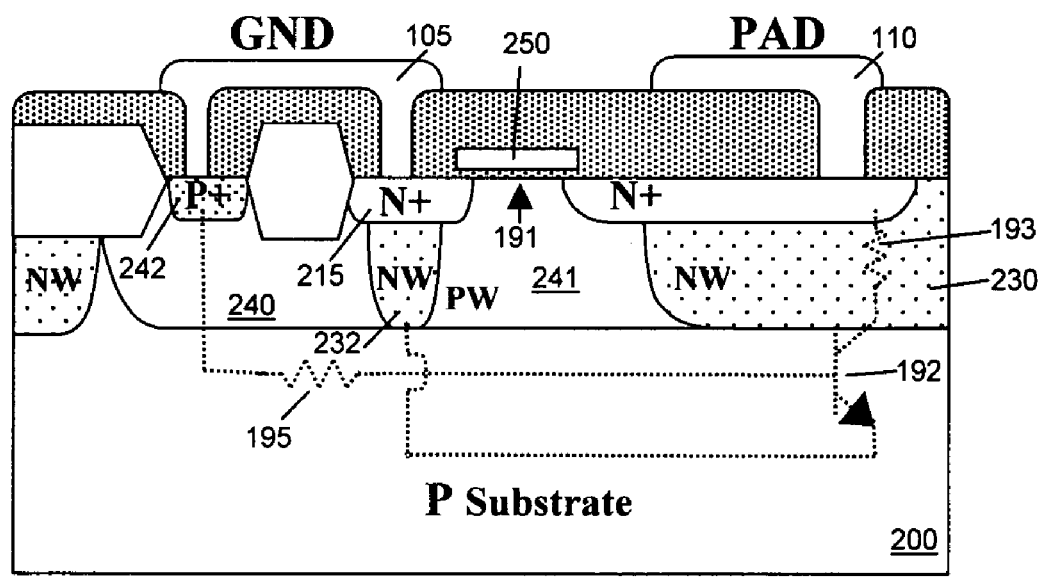
Figure 5:
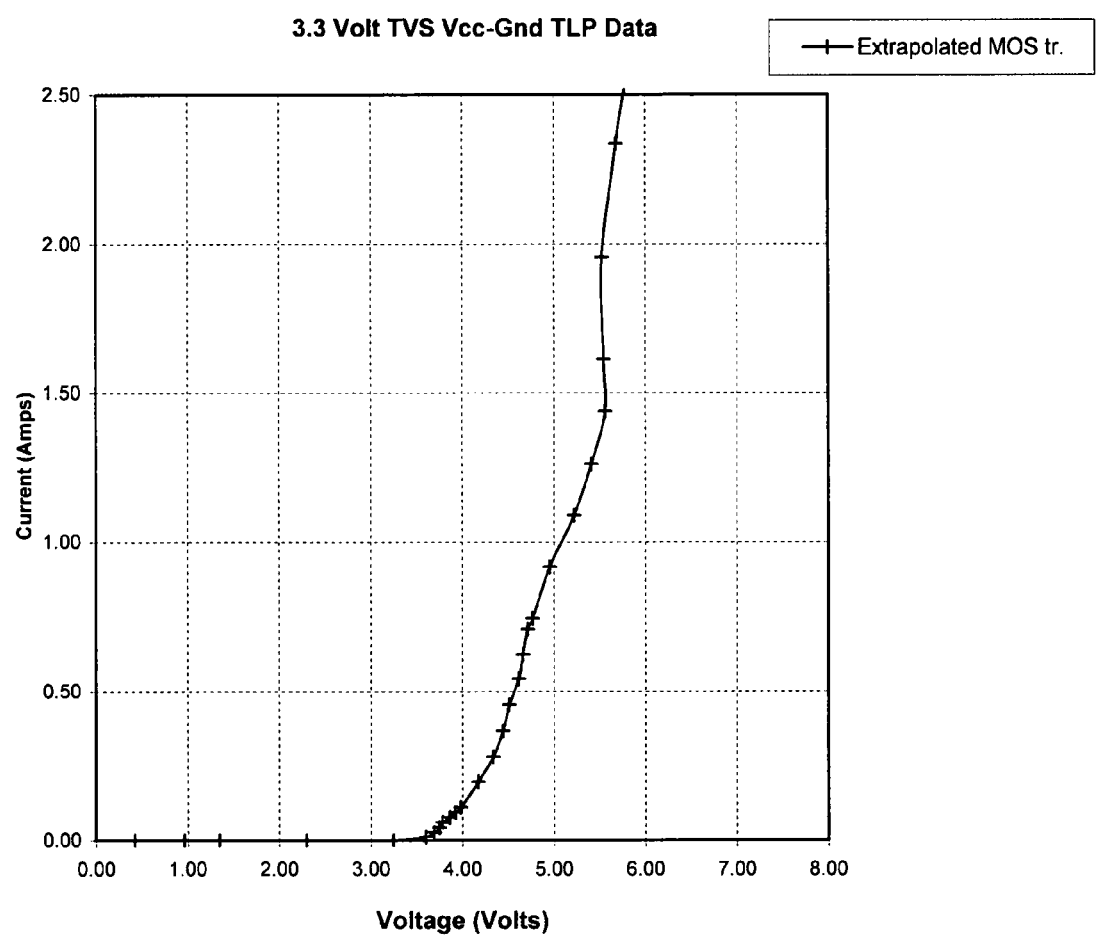
FIG. 5 is an I-V diagram for showing an improved clamping performance of the TVS disclosed in this invention.

FIG. 4B is a top view of the main clamp circuit 190 and FIGS. 4C and 4D are the cross sectional views of the main clamp circuit 190 at the line AA' and BB' respectively. The TVS includes the improved trigger NMOS 191 integrated with NPN bipolar transistor 192 and the PNP bipolar transistor 194 thus forming the SCR. The new TVS as shown in FIGS. 4A to 4B are manufactured with mainstream CMOS technology. FIG. 4C shows the main clamp circuit supported on a P substrate 200. A pair of N+ regions 215 under a gate 250 constitutes the drain and source of trigger NMOS 191 while a P-well 241 under the gate 216 forms as the body of NMOS. A P+ region 220 disposed next to an N well region 230 above P substrate 200 forms PNP transistor 194, with P substrate 200 connecting to Gnd pad 105 through P well 240 and P region 242 and P+ region 220 connected to Vcc pad 110. The lateral path in P substrate 200 from N well 230 to P well 240 provides the resistance for resistor 195. The resistance of resistor 193 can be adjusted by the adjusting the width of P+ region 220 and dopant concentration of N-well 230. The N-well 230 and N-well 232 disposed above the P-substrate 200 constitute the NPN transistor 192. Optional P-type regions 210 formed next to the NMOS source and drain N+ regions 215 within P well 240 constitute protection diodes to lower down the breakdown of trigger NMOS transistor 191 from about 10 Volts to about 6 Volts, at the same time provide more substrate current to turn on NPN/SCR. The N+ and P+ diffusion regions 215 and 220 in FIG. 4B are masked by the active region. The NW 230 below the N+ regions 215 is connected to Vcc 110 that increases the base resistance of the PNP transistor and also helps to turn-on the SCR at high currents. The P+ region 220 of the SCR anode region is also staggered in the layout to control the SCR holding current. The NW 230 under the P+ emitter 220 or anode forms the collector of the NPN transistor that forms part of the SCR. With a circuit and the device configurations shown above, FIG. 5 is an I-V diagram for depicting the transient voltage protection function provided by the TVS. The purpose of achieving a transient voltage protection at approximately 3.3 volts is therefore accomplished.

According to FIGS. 3 and 4, this invention discloses an electronic device with a MOS trigger SCR triggered by a specially configured triggering circuit integrated on a single chip to provide TVS protection at voltages below five volts. In an exemplary embodiment, the TVS circuit of the electronic device includes a triggering MOS transistor connected between an emitter and a collector of a first bipolar-junction transistor (BJT) coupled to a second BJT of complemented type to form a SCR functioning as a main clamp circuit of the TVS circuit. In an exemplary embodiment, the electronic device further includes a triggering circuit for generating a triggering signal to the triggering MOS transistor wherein the triggering circuit includes multiple MOS transistors stacked together for turning into a conductive state by a transient voltage while maintaining a low leakage current. In another exemplary embodiment, the multiple stacked MOS transistors further include multiple stacked PMOS transistors. In another exemplary embodiment, the multiple stacked MOS transistors further includes multiple stacked PMOS transistors each with a body region tied to a source or to a Vcc voltage to create a reverse bias. In another exemplary embodiment, the triggering circuit further includes a NMOS transistor and a CMOS transistor for generating the triggering signal for the triggering MOS transistor. In another exemplary embodiment, the multiple stacked MOS transistors further include multiple stacked transistors each with a body region tied to a source or to a Vcc voltage to create a reverse bias for turning into a conductive state by a transient voltage between three to five volts while maintaining a low leakage current. In another exemplary embodiment, the first BJT further includes a NPN bipolar junction transistor (BJT). In another exemplary embodiment, the triggering MOS transistor further includes a NMOS transistor. In another exemplary embodiment, the second BJT further includes a PNP bipolar junction transistor In another exemplary embodiment, the second BJT coupled to the first BJT forming a silicon controlled rectifier (SCR) wherein the second BJT triggering a SCR current to transmit through the SCR for further limiting an increase of a reverse blocking voltage caused by a transient voltage. In another exemplary embodiment, the triggering MOS transistor triggering the second BJT for transmitting a current through the second BJT in a BJT mode and turning on the SCR at a higher reverse current than an initial current transmitting through the second BJT. In another exemplary embodiment, the triggering circuit, the MOS transistor and the first and second BJT are manufactured with a standard CMOS technology and disposed on a semiconductor substrate as an integrated circuit (IC) chip. In another exemplary embodiment, the triggering circuit, the MOS transistor and the first and second BJT are implemented as discrete circuit devices. In another exemplary embodiment, the triggering circuit, the MOS transistor and the first and second BJT are implemented as a mixture of discrete circuit devices and as integrated circuit (IC) chip by applying a standard CMOS technology and with the IC chip disposed on a semiconductor substrate. In another exemplary embodiment, the triggering circuit, the MOS transistor and the first and second BJT are manufactured with a standard Bi-CMOS technology and disposed on a semiconductor substrate as an integrated circuit (IC) chip. In another exemplary embodiment, the TVS circuit further includes guard ring for suppressing a latch-up during an ESD transients between an I/O pad to a high voltage Vcc terminal. In another exemplary embodiment, the triggering circuit, the MOS transistor and the first and second BJT are formed in a semiconductor substrate by implanting and configuring dopant regions of a first and a second conductivity types in a N-well and a P-well whereby the TVS can be formed in parallel as part of the manufacturing processes of the electronic device.

With the above circuit diagrams and the device cross-sections, the invention shows the TVS operations and array integration of the improved TVS devices that is able to achieve a reduced voltage of protection between three to five volts and overcoming the leakage current problems. In the meantime, these TVS devices provide improved clamp protections that occupy smaller area and perform good clamping function because the SCRs are able to carry high currents with little voltage drop beyond trigger diode breakdown.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A transient voltage suppressing (TVS) circuit comprising:
    a triggering MOS transistor connected between an emitter and a collector of a first bipolar-junction transistor (BJT) coupled in parallel to a second BJT to function as a main clamp circuit of said TVS circuit;
    said triggering MOS transistor is formed in a semiconductor substrate of a first conductivity with a source and drain region of a second conductivity type disposed immediately below a top surface of said semiconductor substrate on two opposite sides of a lateral gate on the top surface of said semiconductor substrate within a doped well of the first conductivity type; and
    a first doped connection region of said second conductivity type extended downwardly from said source region encompassed in and extended through said well of said first conductivity type to a lower portion above a bottom surface of said substrate of said first conductivity constituting a doped connection to an emitter of said first BJT connected in parallel to said triggering MOS transistor.

2. The transient voltage suppressing (TVS) circuit of claim 1 further comprising:
    a triggering circuit for generating a triggering signal for inputting to said gate of said triggering MOS transistor wherein said triggering circuit includes multiple stacked MOS transistors functioning as MOS diodes connected to an I/O pad of the TVS circuit for turning into a conductive state when a transient voltage greater than a Vcc operational voltage is applied thereon while maintaining a low leakage current in a normal off-state.

3. The transient voltage suppressing (TVS) circuit of claim 2 wherein:
    said multiple stacked MOS transistors further comprising multiple stacked PMOS transistors.

4. The transient voltage suppressing (TVS) circuit of claim 2 wherein:
    said multiple stacked MOS transistors further comprising multiple stacked PMOS transistors each with a body region tied to a source region of said PMOS transistor or to said Vcc voltage to create a reverse bias whereby a number of said multiple stacked MOS transistors is determined and designed to generate a specific trigger voltage of said triggering circuit.

5. The transient voltage suppressing (TVS) circuit of claim 2 wherein:
    said triggering circuit further comprises a NMOS transistor and a PMOS transistors for generating said triggering signal for inputting to the gate of said triggering MOS transistor.

6. The transient voltage suppressing (TVS) circuit of claim 2 wherein:
    said multiple stacked MOS transistors further comprising multiple stacked PMOS transistors each with a body region tied to a source region of said PMOS transistor or to said Vcc voltage to create a reverse bias for turning into a conductive state by a transient voltage between three to five volts while maintaining a low leakage current.

7. The transient voltage suppressing (TVS) circuit of claim 1 wherein:
    said first doped connection region of said second conductivity type extended downwardly from said source region is a first N-doped elongated connection region and said first BJT further comprising a NPN bipolar junction transistor (BJT).

8. The transient voltage suppressing (TVS) circuit of claim 1 wherein:
    said triggering MOS transistor further comprising a NMOS transistor comprising said source and drain regions of an N conductivity type disposed in a P-well constituting said doped well of said first conductivity type.

9. The transient voltage suppressing (TVS) circuit of claim 1 wherein:
    said second BJT coupled in parallel to said first BJT forming a silicon controlled rectifier (SCR) wherein said first BJT triggering a SCR current to transmit through said SCR for further limiting an increase of a reverse blocking voltage caused by a transient voltage.

10. The transient voltage suppressing (TVS) circuit of claim 1 wherein:
said triggering MOS transistor triggering said first BJT for transmitting a current through said first BJT in a BJT mode and turning on said SCR at a higher reverse current than an initial current transmitting through said first BJT.

11. The transient voltage suppressing (TVS) circuit of claim 1 further comprising:
at least a steering diode connect in parallel to a triggering diode for electrically connecting to an I/O terminal for steering a normal current between a high voltage and a low voltage terminal.

12. The transient voltage suppressing (TVS) circuit of claim 2 wherein:
said triggering MOS transistor is formed in a P-type semiconductor substrate and said source and drain regions are formed as N-regions disposed on two opposite sides of said lateral gate of said MOS transistor.

13. The transient voltage suppressing (TVS) circuit of claim 2 wherein:
said triggering circuit, said MOS transistor and said first and second BJT are implemented as discrete circuit devices.

14. The transient voltage suppressing (TVS) circuit of claim 2 wherein:
said triggering circuit comprises discrete circuit devices and said MOS transistor and said first and second BJT are formed as an integrated circuit (IC) chip by applying a standard CMOS technology on a semiconductor substrate.

15. The transient voltage suppressing (TVS) circuit of claim 2 wherein:
said triggering circuit, said triggering MOS transistor and said first and second BJT are manufactured with a standard Bi-CMOS technology and disposed on said semiconductor substrate as an integrated circuit (IC) chip.

16. An electronic device formed as an integrated circuit (IC) wherein the electronic device further includes an transient voltage suppressing (TVS) circuit comprising:
a triggering MOS transistor connected between an emitter and a collector of a first bipolar-junction transistor (BJT) coupled in parallel to a second BJT to function as a main clamp circuit of said TVS circuit;
said triggering MOS transistor is formed in a semiconductor substrate of a first conductivity with a source and drain region of a second conductivity type disposed immediately below a top surface of said semiconductor substrate on two opposite sides of a lateral gate on the top surface of said semiconductor substrate within a doped well of the first conductivity type; and
a first doped connection region of said second conductivity type extended downwardly from said source region encompassed in and extended through said well of said first conductivity type to a lower portion above a bottom surface of said substrate of said first conductivity constituting a doped connection to an emitter of said first BJT connected in parallel to said triggering MOS transistor.

17. The electronic device of claim 16 further comprising:
a triggering circuit for generating a triggering signal for inputting to said gate of said triggering MOS transistor wherein said triggering circuit includes multiple stacked MOS transistors functioning as MOS diodes connected to an I/O pad of the TVS circuit for turning into a conductive state when a transient voltage greater than a Vcc operational voltage is applied thereon while maintaining a low leakage current in a normal off-state.

18. The electronic device of claim 17 wherein:
said multiple stacked MOS transistors further comprising multiple stacked PMOS transistors.

19. The electronic device of claim 17 wherein:
said multiple stacked MOS transistors further comprising multiple stacked PMOS transistors each with a body region tied to a source region of said PMOS transistor or to a Vcc voltage to create a reverse bias whereby a number of said multiple stacked PMOS transistors is determined and designed to generate a specific trigger voltage of said triggering circuit.

20. The electronic device of claim 17 wherein:
said triggering circuit further comprises a NMOS transistor and a PMOS transistors for generating said triggering signal for inputting to the gate of said triggering MOS transistor.

21. The electronic device of claim 17 wherein:
said multiple stacked MOS transistors further comprising multiple stacked PMOS transistors each with a body region tied to a source region of said PMOS transistor or to a Vcc voltage to create a reverse bias for turning into a conductive state by a transient voltage between three to five volts while maintaining a low leakage current.

22. The electronic device of claim 16 wherein:
said first doped connection region of said second conductivity type extended downwardly from said source region is a first N-doped elongated connection region and said first BJT further comprising a NPN bipolar junction transistor (BJT).

23. The electronic device of claim 16 wherein:
said triggering MOS transistor further comprising a NMOS transistor comprising said source and drain regions of an N conductivity type disposed in a P-well constituting said doped well of said first conductivity type.

24. The electronic device of claim 16 wherein:
said second BJT further comprising a PNP bipolar junction transistor (BJT).

25. The electronic device of claim 16 wherein:
said second BJT coupled in parallel to said first BJT forming a silicon controlled rectifier (SCR) wherein said first BJT triggering a SCR current to transmit through said SCR for further limiting an increase of a reverse blocking voltage caused by a transient voltage.

26. The electronic device of claim 16 wherein:
said triggering MOS transistor triggering said first BJT for transmitting a current through said first BJT in a BJT mode and turning on said SCR at a higher reverse current than an initial current transmitting through said first BJT.

27. The electronic device of claim 17 wherein:
said triggering circuit, said MOS transistor and said first and second BJT are manufactured with a standard CMOS technology and disposed on said semiconductor substrate as an integrated circuit (IC) chip.

28. The electronic device of claim 17 wherein:
said triggering circuit comprises discrete circuit devices.

29. The electronic device of claim 17 wherein:
said triggering circuit comprises discrete circuit devices and said MOS transistor and said first and second BJT are formed as an integrated circuit (IC) chip by applying a standard CMOS technology on a semiconductor substrate.

30. The electronic device of claim 17 wherein:
said triggering circuit, said MOS transistor and said first and second BJT are manufactured with a standard Bi-CMOS technology and disposed on said semiconductor substrate as an integrated circuit (IC) chip.

31. The electronic device of claim 17 wherein:
said TVS circuit further comprising a guard ring for suppressing a latch-up during an electrostatic discharge (ESD) between an I/O pad to a high voltage Vcc terminal.

32. The electronic device of claim 17 wherein:
said triggering circuit, said MOS transistor and said first and second BJT are formed in said semiconductor substrate by implanting and configuring dopant regions of a first and a second conductivity types in a N-well and a P-well whereby said TVS are formed by applying simultaneous manufacturing processes in manufacturing said electronic device.

33. A method for manufacturing an electronic device with an integrated transient voltage suppressing (TVS) circuit comprising:
connecting a triggering MOS transistor between an emitter and a collector of a first bipolar-junction transistor (BJT) and coupling a second BJT in parallel to function as a main clamp circuit of said TVS circuit; and wherein:
said step of connecting said triggering MOS transistor further comprising a step of forming said triggering MOS transistor in a semiconductor substrate of a first conductivity with a source and drain region of a second conductivity type disposed immediately below a top surface of said semiconductor substrate within a doped well of the first conductivity type on two opposite sides of a lateral gate on the top surface of said semiconductor substrate; and
said step of connecting the first BJT comprising a step of forming a first doped connection region of said second conductivity type to extend downwardly from said source region encompassed in and extended through said well of said first conductivity type to a lower portion above a bottom surface of said substrate of said first conductivity to constitute a doped connection to an emitter of said first BJT connected in parallel to said triggering MOS transistor.

34. The method of claim 33 further comprising:
generating a triggering signal from a triggering circuit for inputting to the gate of said triggering MOS transistor by stacking multiple MOS transistors functioning as MOS diodes for receiving a transient voltage to conducting a current therethrough.

35. The method of claim 34 wherein:
said step of stacking said multiple MOS transistors comprising a step of stacking multiple PMOS transistors.

36. The method of claim 34 wherein:
said step of stacking said multiple MOS transistors comprising stacking multiple PMOS transistors each with a body region tied to a source region of said MOS transistor or to a Vcc voltage to create a reverse bias whereby a number of said multiple stacked MOS transistors is determined and designed to generate a specific trigger voltage.

37. The method of claim 34 wherein:
said step of generating said triggering signal from said triggering circuit further comprising a step of connecting said multiple stacked MOS transistors to NMOS transistor and CMOS transistors for generating said triggering signal for inputting to said triggering MOS transistor.

38. The method of claim 34 wherein:
said step of stacking said multiple MOS transistors further comprising stacking multiple PMOS transistors each with a body region tied to a source region of said MOS transistor or to a Vcc voltage to create a reverse bias for turning into a conductive state by a transient voltage between three to five volts while maintaining a low leakage current.

39. The method of claim 36 wherein:
said step of stacking multiple PMOS transistors each with a body region tied to a source region of said MOS transistor or to a Vcc voltage further comprising a step of adjusting a number of said stacked PMOS transistors with said body regions connected to said source regions of said PMOS transistors or to said voltage supply to adjust said trigger voltage.

\* \* \* \* \*